(12) United States Patent
Cruz-Hernandez et al.

(10) Patent No.: US 8,179,202 B2
(45) Date of Patent: May 15, 2012

(54) MULTIPLE PULSE WIDTH MODULATION

(75) Inventors: Juan Manuel Cruz-Hernandez, Montreal (CA); Danny A. Grant, Montreal (CA)

(73) Assignee: Immersion Corporation, San Jose, CA (US)

( * ) Notice: Subject to any disclaimer, the term of this patent is extended or adjusted under 35 U.S.C. 154(b) by 1103 days.

(21) Appl. No.: 11/675,967

(22) Filed: Feb. 16, 2007

(65) Prior Publication Data

US 2008/0197901 A1    Aug. 21, 2008

(51) Int. Cl.
*H03K 7/08* (2006.01)
(52) U.S. Cl. .............................. 332/109; 327/175
(58) Field of Classification Search .................. 332/109; 327/175; 345/156
See application file for complete search history.

(56) References Cited

U.S. PATENT DOCUMENTS

| | | | | |
|---|---|---|---|---|
| 6,411,401 | B1 * | 6/2002 | Ebner et al. | 358/1.9 |
| 6,762,745 | B1 * | 7/2004 | Braun et al. | 345/156 |
| 7,154,470 | B2 | 12/2006 | Tierling | |
| 2002/0005861 | A1 * | 1/2002 | Lewis | 345/691 |

OTHER PUBLICATIONS

Logitech, Inc., CyberMan 3D SWIFT Supplement, Version 1.0a, revised Feb. 10, 1994.

* cited by examiner

*Primary Examiner* — Joseph Chang
(74) *Attorney, Agent, or Firm* — Squire Sanders (US) LLP

(57) ABSTRACT

A method of generating a MPWM signal for a portable device such as a cellular telephone. For a first duty cycle that includes a MPWM frequency having N magnitude levels, the method generates a first waveform comprising a first and a second On pulse during a first MPWM frequency period. The first and second On pulses are separated by an Off period.

20 Claims, 4 Drawing Sheets

Low frequency MPWM generation with an interlaced pattern

Low frequency MPWM generation with an interlaced pattern

MULTIPLE PULSE WIDTH MODULATION

FIELD OF THE INVENTION

One embodiment is directed to generating a control signal. More particularly, one embodiment is directed to generating a control signal having multiple pulse width modulation.

BACKGROUND INFORMATION

Electronic device manufacturers strive to produce a rich interface for users. Conventional devices use visual and auditory cues to provide feedback to a user. In some interface devices, kinesthetic feedback (such as active and resistive force feedback) and/or tactile feedback (such as vibration, texture, and heat) is also provided to the user, more generally known collectively as "haptic feedback." Haptic feedback can provide cues that enhance and simplify the user interface. Specifically, vibration effects, or vibrotactile haptic effects, may be useful in providing cues to users of electronic devices to alert the user to specific events, or provide realistic feedback to create greater sensory immersion within a simulated or virtual environment.

Haptic feedback has also been increasingly incorporated in portable electronic devices, such as cellular telephones, personal digital assistants ("PDA"s), portable gaming devices, and a variety of other portable electronic devices. For example, some portable gaming applications are capable of vibrating in a manner similar to control devices (e.g., joysticks, etc.) used with larger-scale gaming systems that are configured to provide haptic feedback. Additionally, devices such as cellular telephones and PDAs are capable of providing various alerts to users by way of vibrations. For example, a cellular telephone can alert a user to an incoming telephone call by vibrating. Similarly, a PDA can alert a user to a scheduled calendar item or provide a user with a reminder for a "to do" list item or calendar appointment.

In many devices, an actuator is used to create the vibrations that comprise some haptic feedback. Digital-to-analog ("D/A") converter ports or pulse width modulation ("PWM") ports embedded in the main microcontroller are sometimes used to control the actuator. For cost and efficiency reasons, the PWM port is preferred over the D/A port. A PWM signal is a method of generating analog values with a digital signal switched at very high frequencies (e.g., >1 KHz and typically as high as 200 KHz), while varying the duty cycle. The high frequencies are usually generated on dedicated hardware, and the duty cycle is usually modified at low frequencies (<1 KHz) by software to control the magnitude of the actuator.

A typical portable electronic devices, such as a cellular telephone, operates at a relatively low frequency (e.g., <200 Hz) which is the frequency typically used to modify the PWM duty cycle. Although not an optimal implementation, the low frequency is able to generate a wide range of magnitudes that for haptic effects are sufficient to create compelling vibration effects. However, because of the complexity of the required driving electronic circuits for A/D or PWM ports, the large amount of required circuit board space, and the high electronic costs, a need developed for a new method and interface for controlling the magnitude of the actuator. New devices to satisfy this need use a simple General Purpose Input Output ("GPIO") port, as opposed to the D/A or PWM ports, thus reducing the implementation cost of controlling the actuator since no dedicated hardware to generate a high PWM signal is required. However, the GPIO devices have introduced a need for an improved system and method for generating PWM signals in a low frequency device.

SUMMARY OF THE INVENTION

One embodiment is a method of generating a multiple pulse width modulation signal for a portable device such as a cellular telephone. For a first duty cycle that includes a multiple pulse width modulation frequency having N magnitude levels, the method generates a first waveform comprising a first and a second On pulse during a first multiple pulse width modulation frequency period. The first and second On pulses are separated by an Off period.

DETAILED DESCRIPTION

One embodiment is a controller that generates a multiple pulse width modulation ("MPWM") signal in which each duty cycle includes a series of pulses instead of a single continuous pulse. The MPWM signal produces the same number of magnitude levels as the prior art PWM signals, but with a higher frequency content. In another embodiment, the number of magnitude levels is increased.

Figure 1:
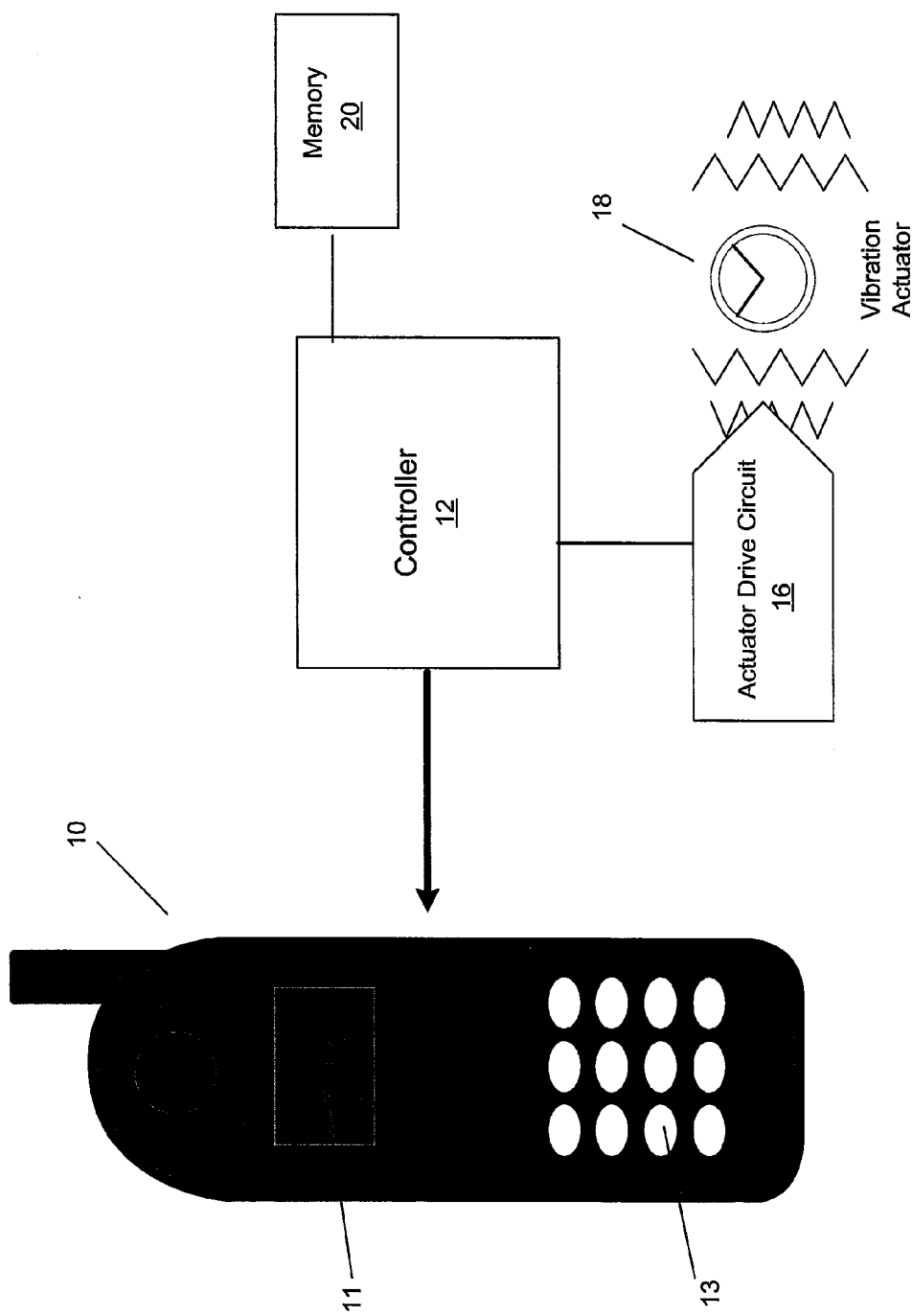
FIG. 1 is a block diagram of a cellular telephone in accordance with one embodiment.

FIG. 1 is a block diagram of a cellular telephone 10 in accordance with one embodiment. Telephone 10 includes a screen 11 and keys 13. In one embodiment, keys 13 are mechanical type keys. In another embodiment, keys 13 can be implemented by a touchscreen so that keys 13 are touchscreen keys, or can be implemented using any method. Internal to telephone 10 is a haptic feedback system that generates vibrations on telephone 10. In one embodiment, the vibrations are generated on the entire telephone 10. In other embodiments, specific portions of telephone 10 can be haptically enabled by the haptic feedback system, including individual keys of keys 13, whether the keys are mechanically oriented, touchscreen, or some other type of implementation.

The haptic feedback system includes a controller 12. Coupled to controller 12 is a memory 20 and an actuator drive circuit 16, which is coupled to a vibration actuator 18. Although the embodiment of FIG. 1 is a cellular telephone, embodiments of the present invention can be implemented with any type of handset or mobile/portable device, or any device that uses an actuator to generate vibrations.

Controller 12 may be any type of general purpose controller or processor, or could be a controller specifically designed to provide haptic effects, such as an application-specific integrated circuit ("ASIC"). Controller 12 may be the same controller/processor that operates the entire telephone 10, or may be a separate controller. Controller 12 can decide what haptic effects are to be played and the order in which the effects are played based on high level parameters. In general, the high level parameters that define a particular haptic effect include magnitude, frequency and duration. In one embodiment, controller 12 is clocked at a relatively low frequency (e.g., <1 KHz). In one embodiment, controller 12 is clocked at approximately 200 Hz and telephone 10 has a clock duration cycle of approximately 5 ms.

Controller 12 outputs the control signals to drive circuit 16 which includes electronic components and circuitry used to supply actuator 18 with the required electrical current and voltage to cause the desired haptic effects. In one embodiment, the control signals are output through a GPIO port. Actuator 18 is a haptic device that generates a vibration on telephone 10. Actuator 18 can include one or more force applying mechanisms which are capable of applying a vibrotactile force to a user of telephone 10 (e.g., via the housing of telephone 10). Actuator 18 may be, for example, an electromagnetic actuator, an Eccentric Rotating Mass ("ERM") in which an eccentric mass is moved by a motor, a Linear Resonant Actuator ("LRA") in which a mass attached to a spring is driven back and forth, or a "smart material" such as piezoelectric, electro-active polymers or shape memory alloys. Memory device 20 can be any type of storage device, such as random access memory ("RAM") or read-only memory ("ROM"). Memory device 20 stores instructions executed by controller 12. Memory device 20 may also be located internal to controller 12, or any combination of internal and external memory.

In one embodiment, controller 12 generates an MPWM signal that causes actuator 18 to generate the desired haptic feedback vibrations. In general, a PWM signal is a method of generating resulting analog values with a digital signal switched at very high frequencies, while varying the duty cycle, due to the low pass nature of the actuator. A PWM signal is considered "digital" because it is limited to two possible states: On or Off. Therefore, a square signal is generated at some specific frequency, usually higher than 1 KHz, and sometimes as high as 200 KHz in some prior art devices. The PWM will generate resultant different magnitude values as a function of the duty cycle of the square signal. The duty cycle of the square signal is the percentage of the time the signal is in the On state. A square signal with 100% duty cycle means that the square signal is On all the time, thus producing a maximum resultant amplitude value, and a 0% duty cycle means that the square signal is Off all the time, thus producing a 0 magnitude value. In order to generate more magnitude values, the duty cycle is varied. For example, a 50% duty cycle will result in a 50% magnitude, a 25% duty cycle results in a 25% magnitude, etc.

In general, the clock rate of a device will control the number of magnitude values that are possible with a PWM signal. For example, in order to generate a 1 KHz PWM signal capable of generating 256 magnitude levels, a clock rate of (1/1000)/256 is needed. If more levels are desired, the clock rate should be faster in accordance with the following equation:

$$\text{ClockRate} = 1/f_{PWM} * N$$

Where $f_{PWM}$ is the frequency of the PWM signal and N is the number of magnitude levels that the PWM signal can generate. Therefore, for a cellular telephone or other device having a clock duration cycle of 5 ms, and for N=9 levels, the PWM frequency is $f_{PWM}$=22.22 Hz. This means the controller of the device will generate a square signal of 22.22 Hz (or 45 ms long).

Figure 2:
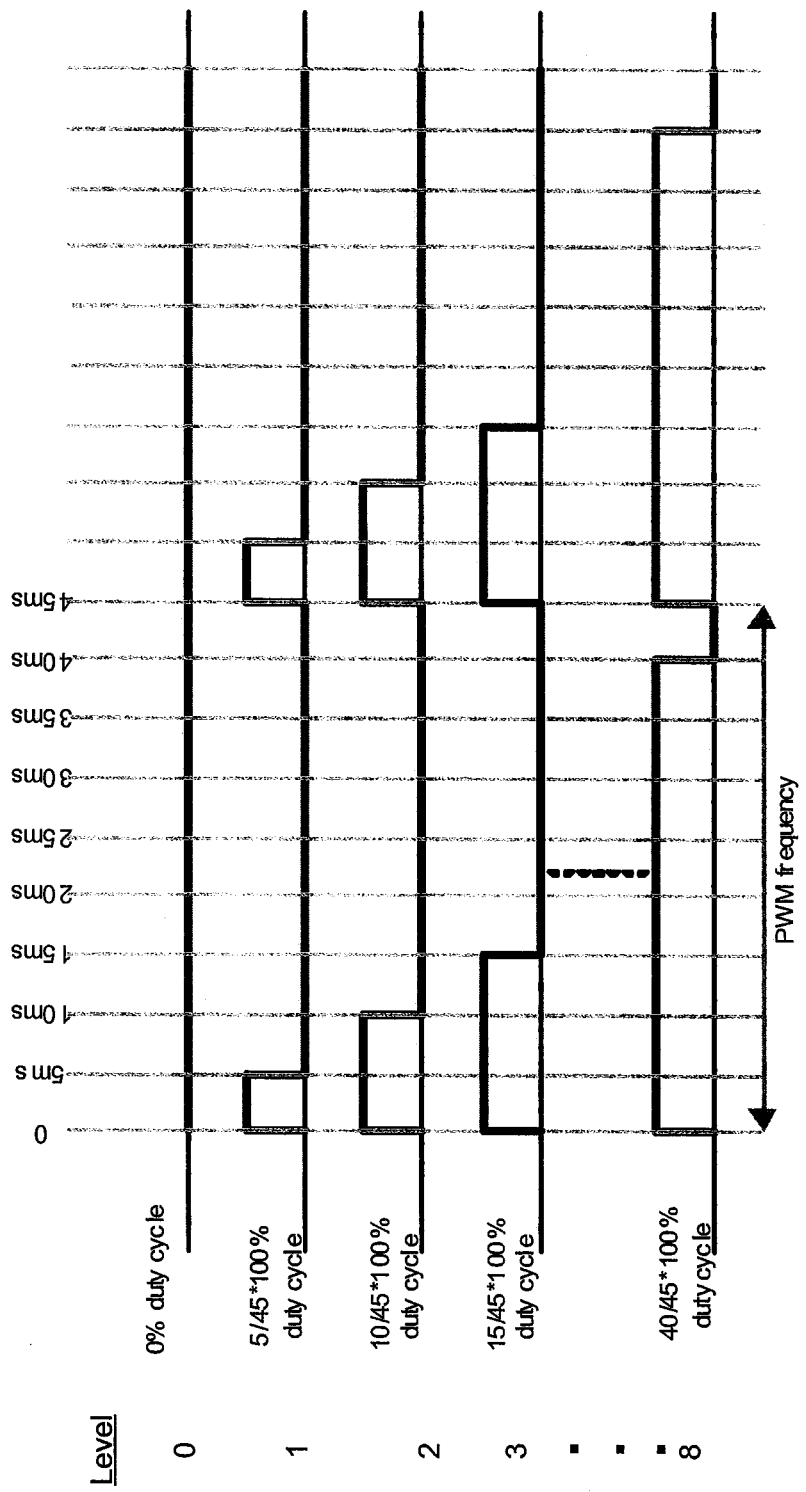
FIG. 2 illustrates waveforms that show some of the duty cycles or levels that a nine level prior art PWM signal with a PWM frequency of 22.22 Hz in a device with a clock duration cycle of 5 ms can generate.

FIG. 2 illustrates waveforms that show some of the duty cycles or levels that a nine level prior art PWM signal with a PWM frequency of 22.22 Hz in a device with a clock duration cycle of 5 ms can generate. The level of magnitudes are 0, 5/45 (level 1), 10/45 (level 2), 15/45 (level 3), 20/45 (level 4), 25/45 (level 5), 30/45 (level 6), 35/45 (level 7), 40/45 (level 8), 45/45 (level 9), or N=9 non-zero magnitude levels.

There are two problems with the prior art PWM implementation shown in FIG. 2. First, for some or most of the magnitude levels, a user can perceive the PWM frequency, especially for low magnitude values. Second, when generating a rapid ramp-up of vibration magnitude, which is a fairly typical haptic effect on a cellular telephone, a user can distinguish the number of magnitude levels in the signal. The transition between levels is not small enough for the user to perceive the changes as continuous. Rather, to the user the changes may appear to be "stepped."

In one embodiment, the clock duration cycle of telephone 10 is approximately 5 ms and controller 12 can generate signals with frequencies as high as 100 Hz. However, actuator 18, as is typical of most known actuators, may not be able to respond as fast as 100 Hz. A typical actuator may be able to produce perceptible vibrations at most at an approximate 5 Hz or 200 ms periodic signal with a 50% duty cycle.

Figure 3:
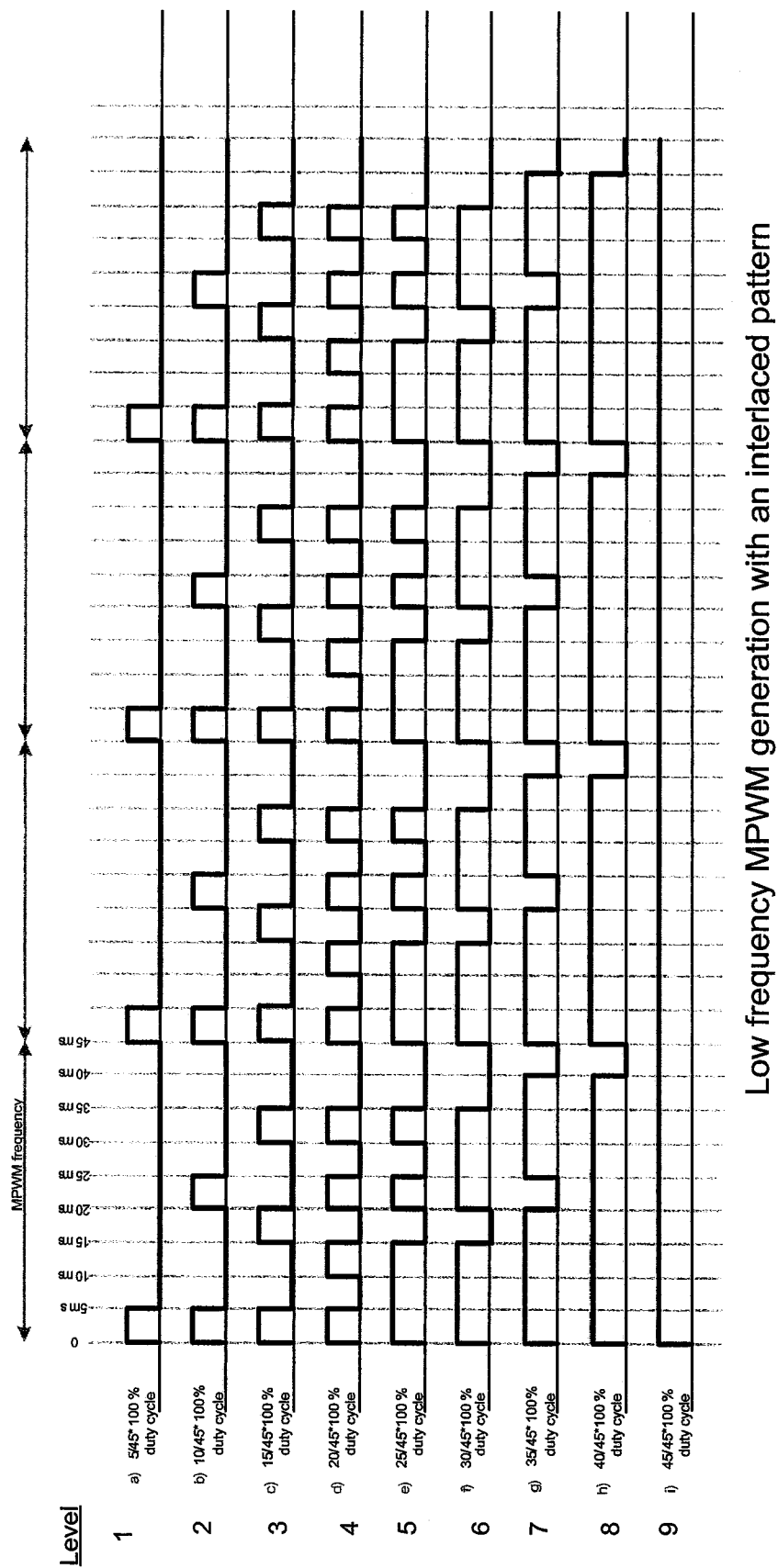
FIG. 3 illustrates waveforms that show the duty cycles or levels that are generated by a controller in accordance with one embodiment.

FIG. 3 illustrates waveforms that show the duty cycles or levels of an MPWM signal that are generated by controller 12 in accordance with one embodiment. In one embodiment, the duty cycle will include a series of On pulses (i.e., an On period, followed by an Off period, followed by an On period, etc.) instead of a continuous longer On pulse, for each magnitude level that includes greater than 5 ms of On during the duty cycle. Therefore, for 5/45*100% duty cycle (level 1) during one 45 ms MPWM frequency period, the generated signal is the same as the PWM signal of FIG. 2. For 10/45*100% duty cycle (level 2), instead of having a single pulse of 10 ms (FIG. 2) and 35 ms off, the signal is broken up into two single pulses of 5 ms. Likewise, at level 3, instead of a 15 ms long pulse in FIG. 2, in embodiments of the present invention, three 5 ms pulses are generated at 0, 15 ms and 30 ms.

The MPWM signals in accordance with embodiments of the present invention produce the same resultant magnitude level as the prior art PWM signals of FIG. 2, but with higher frequency content, thus improving the user perceptibility over the prior art PWM frequency. In general, the embodiment of FIG. 3 spreads out as much as possible the On pulses by interspersing the On pulses with Off periods over each occurrence of MPWM frequency period (i.e., 45 ms for the embodiment of FIG. 3). At other levels, such as levels 5-9, some pulse widths will be greater than 5 ms wide, but if possible multiple On pulses will be spaced with one or more off periods. By including multiple Off periods in each PWM frequency cycle when possible, versus one long OFF pulse, actuator 18 is given less time to slow down, which allows it to have less variation in speed generating a much more consistent vibration. The embodiment of FIG. 3 not only improves on the perceptibility of the prior art PWM frequency, but also improves the perception of magnitude levels, making the transition between any two levels be perceived as continuous.

Figure 4:
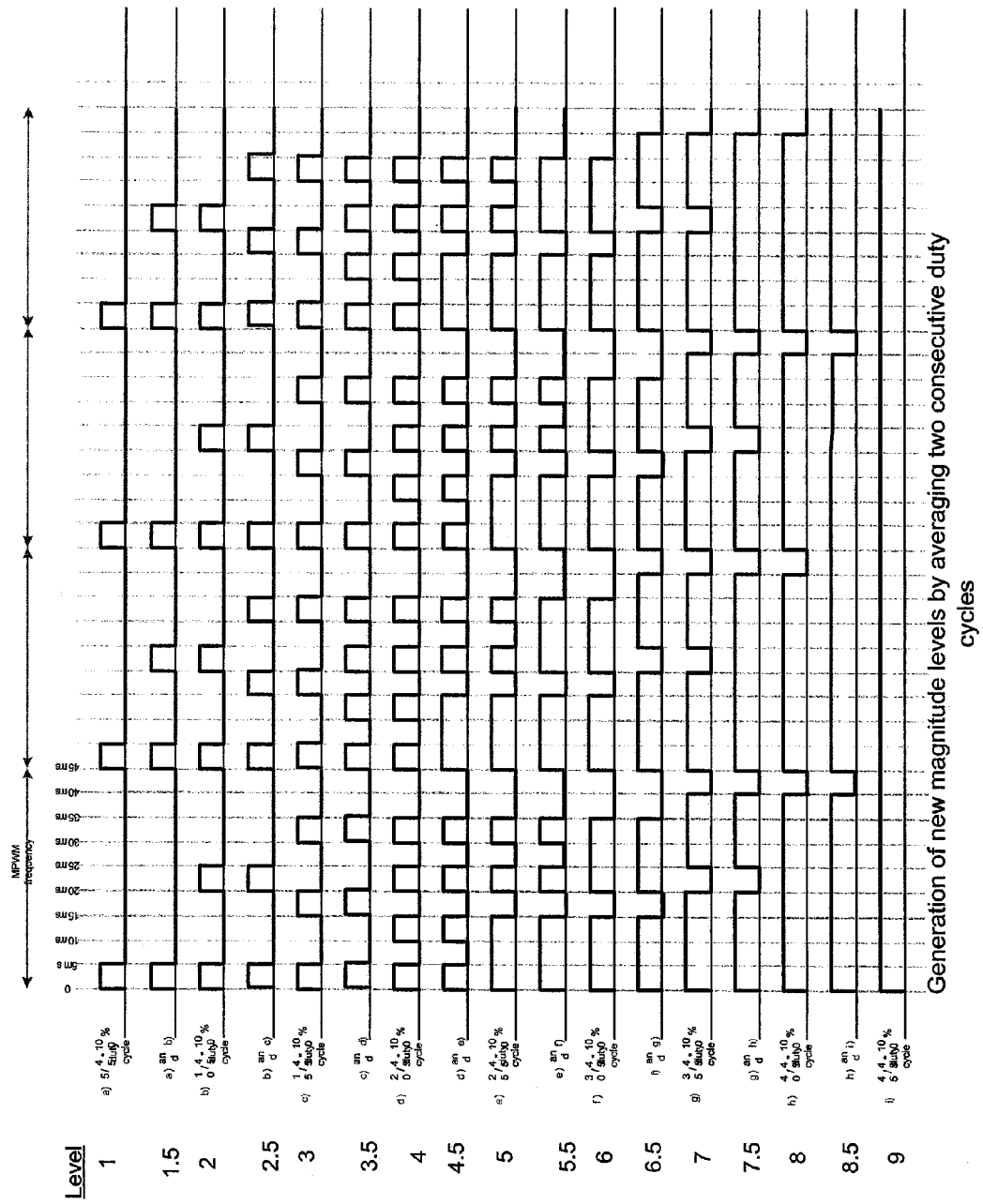
FIG. 4 illustrates waveforms that show some of the duty cycles or levels that are generated by a controller in accordance with another embodiment.

FIG. 4 illustrates waveforms that show some of the duty cycles or levels that are generated by controller 12 in accordance with another embodiment of the present invention. In the embodiment of FIG. 4, similar to the embodiment of FIG. 3, N=9, the MPWM frequency is 22.22 Hz, and the device has a clock duration cycle of 5 ms. Intermediate magnitude levels (e.g., 1.5, 2.5, 3.5, etc.) are generated by averaging the two consecutive duty cycles. To generate an intermediate magnitude level (e.g., level 3.5), one cycle of one magnitude level (e.g., level 3 of FIG. 3) during a first MPWM frequency period is followed by a second cycle during a second MPWM frequency period at the next magnitude level (e.g., level 4 of FIG. 3), then repeating these two cycles over and over. In this embodiment, 2N magnitude levels can be generated for N=9, that will result in 18 magnitude levels. Because the embodiment of FIG. 4 has a higher number of levels than the prior art and the embodiment of FIG. 3, when generating a rapid ramp-up of vibration frequency a user will perceive the variation as continuous rather than stepped.

Several embodiments disclosed are specifically illustrated and/or described herein. However, it will be appreciated that modifications and variations are covered by the above teachings and within the purview of the appended claims without departing from the spirit and intended scope of the invention.

For example, some embodiments disclosed above are implemented in a cellular telephone, which is an object that can be grasped, gripped or otherwise physically contacted and manipulated by a user. As such, the present invention can be employed on other haptics enabled input and/or output devices that can be similarly manipulated by the user. Such other devices can include a touch screen (Global Positioning System ("GPS") navigator screen on an automobile, an automated teller machine ("ATM") display screen), a remote for controlling electronics equipment (audio/video, garage door, home security, etc.) and a gaming controller joystick, mouse, specialized controller, gamepad, etc.). The operation of such input and/or output devices is well known to those skilled in the art.

What is claimed is:

1. A method of generating a multiple pulse width modulation (MPWM) signal for a device, said method comprising:
   generating at a single controller the MPWM signal that comprises at least one On pulse and at least one Off period and that has a number (N) of possible magnitude levels;
wherein the controller has a clock rate (C) and the MPWM signal comprises a plurality of MPWM periods, and each MPWM period is a square signal of a fixed time duration that is generated at a frequency (f), wherein the frequency (f) is directly based on the clock rate (C) of the controller and the number of possible magnitude levels (N) of the MPWM signal;
   wherein the frequency (f) is N/C;
   for at least one of magnitude level of the N magnitude levels, generating a first waveform comprising a first and a second On pulse during a first single MPWM period of the single controller;
   wherein said first and second On pulses are separated by an Off period.

2. The method of claim 1, wherein said device is haptic enabled.

3. The method of claim 2, comprising:
   for a second magnitude level, generating a second waveform during the first single MPWM period; and
   for a third magnitude level, generating the first waveform during the first single MPWM period and generating the second waveform during a second single MPWM period, wherein said second single MPWM period directly follows the first single MPWM period.

4. The method of claim 3, comprising:
   for the third magnitude level, generating the first waveform during a third single duty cycle, wherein said third single MPWM period directly follows the second single MPWM period.

5. The method of claim 4, wherein said MPWM signal comprises N×2 magnitude levels.

6. A haptic enabled apparatus comprising: a single controller for generating a multiple pulse width modulation (MPWM) signal;
   wherein the MPWM signal comprises at least one On pulse and at least one Off period and has a number (N) of possible magnitude levels;
   wherein the single controller has a clock rate (C) and the MPWM signal comprises a plurality of MPWM periods, and each MPWM period is a square signal of a fixed time duration that is generated at a frequency (f), wherein the frequency (f) is directly based on the clock rate (C) of the single controller and the number of possible magnitude levels (N) of the MPWM signal;
   wherein the frequency (f) is N/C;
   wherein said single controller is adapted to, for at least one of magnitude level of the N magnitude levels, generate a first waveform comprising a first and a second On pulse during a first single MPWM period of the single controller;
   wherein said first and second On pulses are separated by an Off period.

7. The apparatus of claim 6, said MPWM generating a haptic signal.

8. The apparatus of claim 7, said controller further adapt to, for a second magnitude level, generate a second waveform during the first MPWM period; and
   for a third magnitude level, generating the first waveform during the first single duty cycle and generate the second waveform during a second single duty cycle, wherein said second single MPWM period directly follows the first single MPWM period.

9. The apparatus of claim 8, said controller further adapt to, for the third magnitude level, generate the first waveform during a third single MPWM period, wherein said third single MPWM period directly follows the second single MPWM period.

10. The apparatus of claim 9, wherein said MPWM signal comprises N×2 magnitude levels.

11. The apparatus of claim 6, further comprising an actuator coupled to said controller, said actuator adapted to generate a vibration in response to the MPWM signal.

12. A computer readable medium having instructions stored thereon that, when executed by a processor, cause the processor to generate a multiple pulse width modulation (MPWM) signal for a device, said MPWM generating comprising:
   generating at a single controller the MPWM signal that comprises at least one On pulse and at least one Off period and that has a number (N) of possible magnitude levels;
   wherein the single controller has a clock rate (C) and the MPWM signal comprises a plurality of MPWM periods, and each MPWM period is a square signal of a fixed time duration that is generated at a frequency (f), wherein the frequency (f) is directly based on the clock rate (C) of the controller and the number of possible magnitude levels (N) of the MPWM signal;
   wherein the frequency (f) is N/C;
   for at least one of magnitude level of the N magnitude levels, generating a first waveform comprising a first and a second On pulse during a first single MPWM period of the single controller;
   wherein said first and second On pulses are separated by an Off period.

13. The computer readable medium of claim 12, wherein said MPWM signal is a haptic signal.

14. The computer readable medium of claim 12, said MPWM generating comprising:
   for a second magnitude level, generating a second waveform during the first single MPWM period; and for a third magnitude level, generating the first waveform during the first MPWM period and generating the second waveform during a second single MPWM period, wherein said second MPWM period directly follows the first MPWM period.

15. The computer readable medium of claim 14, said MPWM generating comprising:

for the third magnitude level, generating the first waveform during a third MPWM period, wherein said third MPWM period directly follows the second MPWM period.

16. The method of claim 15, wherein said MPWM signal comprises N×2 magnitude levels.

17. A single controller for generating a multiple pulse width modulation (MPWM) signal for a device, said single controller comprising:

means for generating at a controller the MPWM signal that comprises at least one On pulse and at least one Off period and that has a number (N) of possible magnitude levels;

wherein the single controller has a clock rate (C) and the MPWM signal comprises a plurality of MPWM periods, and each MPWM period is a square signal of a fixed time duration that is generated at a frequency (f), wherein the frequency (f) is directly based on the clock rate (C) of the controller and the number of possible magnitude levels (N) of the MPWM signal;

wherein the frequency (f) is N/C;

for at least one of magnitude level of the N magnitude levels, generating a first waveform comprising a first and a second On pulse during a first single MPWM period of the single controller;

wherein said first and second On pulses are separated by an Off period.

18. The controller of claim 17, wherein said MPWM signal is a haptic signal.

19. The controller of claim 18, further comprising:

for a second magnitude level, means for generating a second waveform during the first MPWM period; and for a third magnitude level, means for generating the first waveform during the first single MPWM period and generating the second waveform during a second single MPWM period, wherein said second single duty cycle directly follows the first MPWM period.

20. The controller of claim 19 further comprising:

for the third magnitude level, means for generating the first waveform during a third MPWM period, wherein said third MPWM period directly follows the second single MPWM period.

* * * * *